United States Patent
Lee

(10) Patent No.: US 11,688,716 B2
(45) Date of Patent: Jun. 27, 2023

(54) SEMICONDUCTOR CHIP MOUNTING TAPE AND METHOD OF MANUFACTURING SEMICONDUCTOR PACKAGE USING THE TAPE

(71) Applicant: Samsung Electronics Co., Ltd., Suwon-si (KR)

(72) Inventor: Soo Hwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 17/168,476

(22) Filed: Feb. 5, 2021

(65) Prior Publication Data

US 2021/0358882 A1    Nov. 18, 2021

(30) Foreign Application Priority Data

May 12, 2020  (KR) .......................... 10-2020-0056381

(51) Int. Cl.
*H01L 23/00*     (2006.01)
*H01L 25/065*    (2023.01)

(52) U.S. Cl.
CPC .............. *H01L 24/83* (2013.01); *H01L 24/75* (2013.01); *H01L 25/0657* (2013.01); *H01L 2224/83092* (2013.01); *H01L 2224/83874* (2013.01)

(58) Field of Classification Search
None
See application file for complete search history.

(56) References Cited

U.S. PATENT DOCUMENTS

| | | | |
|---|---|---|---|
| 5,297,333 A | 3/1994 | Kusaka | |
| 6,759,274 B2* | 7/2004 | Arai | H01L 21/6836 438/114 |
| 8,153,475 B1* | 4/2012 | Shum | H01L 21/6835 257/E21.034 |
| 8,758,546 B2 | 6/2014 | Ishigami et al. | |
| 9,511,536 B2* | 12/2016 | Dabelstein | B29C 63/0013 |
| 10,147,702 B2* | 12/2018 | Krusor | H01L 24/75 |
| 2004/0076817 A1* | 4/2004 | Rorabaugh | B29C 63/0013 156/289 |
| 2013/0203218 A1* | 8/2013 | Bayerer | H01L 21/50 156/382 |
| 2017/0005062 A1* | 1/2017 | Azuma | H01L 21/6836 |
| 2018/0114772 A1* | 4/2018 | Krusor | H01L 24/97 |
| 2019/0027408 A1* | 1/2019 | Sugiya | H01L 21/78 |
| 2019/0143636 A1* | 5/2019 | Seo | B32B 15/14 361/760 |

(Continued)

FOREIGN PATENT DOCUMENTS

| | | | | |
|---|---|---|---|---|
| CN | 104934374 B | * | 8/2019 | ......... H01L 21/3065 |
| JP | 3594120 B2 | | 11/2004 | |
| JP | 2004319829 A | * | 11/2004 | |

(Continued)

*Primary Examiner* — Telly D Green
(74) *Attorney, Agent, or Firm* — Muir Patent Law, PLLC

(57) ABSTRACT

Provided is a semiconductor chip mounting tape. The semiconductor chip mounting tape comprises a tape base film including first and second surfaces opposite to each other; and an adhesive film including a third surface facing the first surface of the tape base film, and a fourth surface opposite to the third surface, wherein the adhesive film includes a plurality of voids therein, and the fourth surface of the adhesive film may be adhered to a semiconductor chip.

14 Claims, 14 Drawing Sheets

(56) References Cited

U.S. PATENT DOCUMENTS

2019/0304927 A1* 10/2019 Kim .................. H01L 24/48
2021/0358882 A1* 11/2021 Lee .................. H01L 25/0657

FOREIGN PATENT DOCUMENTS

| | | | | |
|---|---|---|---|---|
| JP | 4032317 | B2 | 1/2008 | |
| JP | 4710205 | B2 | 6/2011 | |
| JP | 2017183640 | A * | 10/2017 | ............. B32B 15/08 |
| JP | 2017183641 | A * | 10/2017 | ............. H01L 23/00 |
| JP | 2021185610 | A * | 12/2021 | |
| KR | 20000014967 | A | 3/2000 | |
| KR | 20200111309 | A * | 9/2020 | |
| TW | 202029309 | A * | 8/2020 | |
| WO | WO-2006040848 | A1 * | 4/2006 | ....... H01L 21/67109 |
| WO | WO-2020094095 | A1 * | 5/2020 | ......... H01L 21/6836 |

* cited by examiner

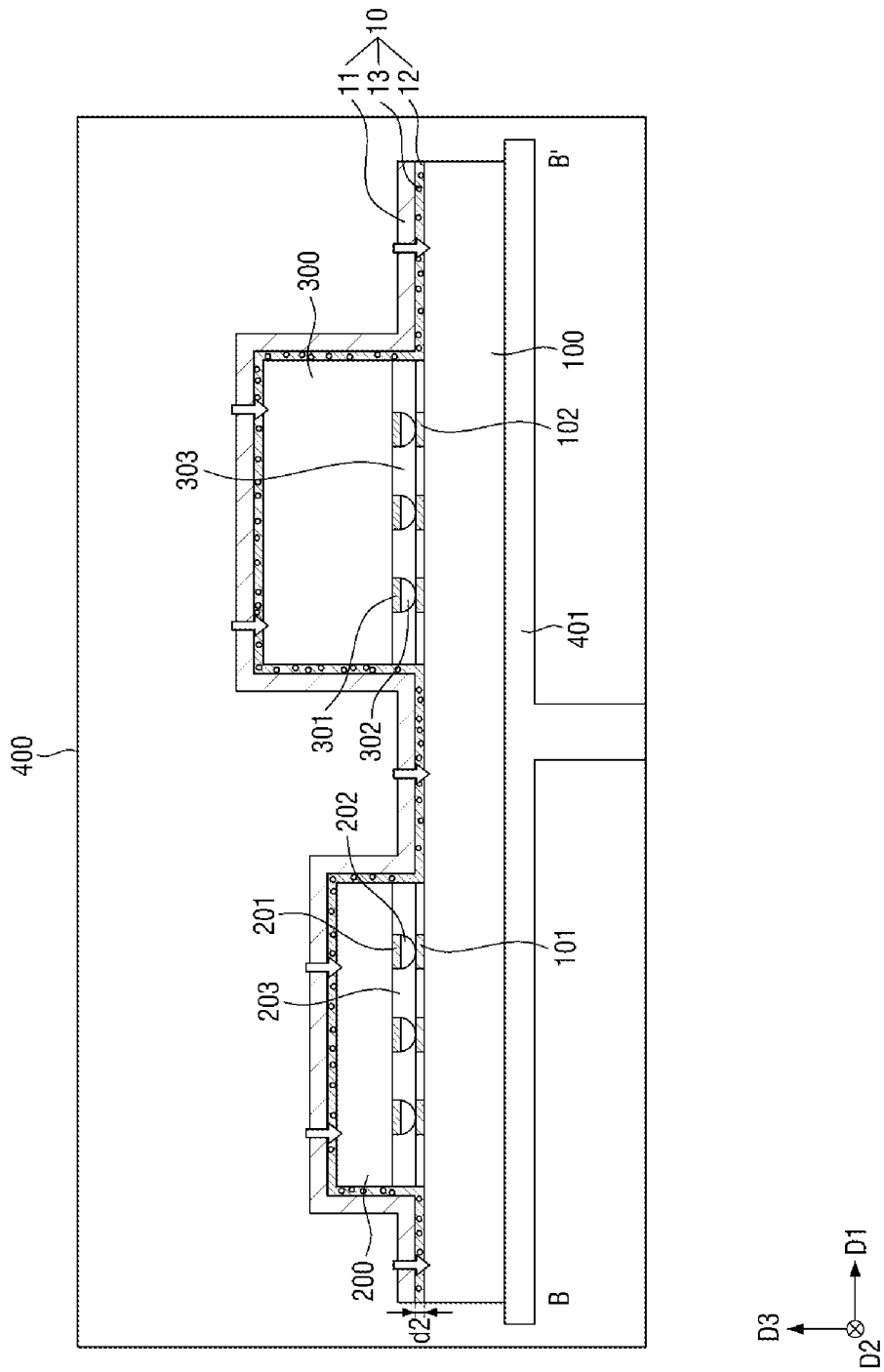

SEMICONDUCTOR CHIP MOUNTING TAPE AND METHOD OF MANUFACTURING SEMICONDUCTOR PACKAGE USING THE TAPE

CROSS-REFERENCE TO RELATED APPLICATION

This application claims priority to Korean Patent Application No. 10-2020-0056381 filed on May 12, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor chip mounting tape and a method of manufacturing a semiconductor package using the tape.

2. Description of the Related Art

In order to improve a high density integrity and productivity of a semiconductor chip, there is a growing need of a wafer level package (WLP). One approach is to mount a plurality of chips on a substrate in such a way of placing individual chips at their bonding positions with a pickup head and heating the individual chips at a predetermined temperature to melt connection terminals arranged beneath individual chips while applying a pressure to allow the connection terminals to maintain a predetermined height.

This means that the per-wafer chip mounting operation takes an amount of time equal to a multiple of the number of the chips being integrated, which affects semiconductor package productivity.

SUMMARY

Aspects of the present disclosure provide a semiconductor chip mounting tape with an adhesive film having voids for improving the semiconductor package productivity.

Aspects of the present disclosure also provide a method of manufacturing a semiconductor package that is capable of improving productivity of a semiconductor package by adjusting pressure to voids in a chip mounting tape.

Aspects of the present disclosure also provide a method of manufacturing a semiconductor package that is capable of improving reliability of the semiconductor package by mounting chips using a chamber.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor chip mounting tape comprising, a tape base film including first and second surfaces opposite to each other and an adhesive film including a third surface facing the first surface of the tape base film, and a fourth surface opposite to the third surface, wherein the adhesive film includes a plurality of voids therein, and the fourth surface of the adhesive film is to be adhered to a semiconductor chip.

According to an aspect of the present disclosure, there is provided a method of manufacturing a semiconductor package, the method comprising providing a substrate including a connection pad, the substrate having a top surface and a bottom surface opposite the top surface, placing a semiconductor chip including a connection terminal on the connection pad, the semiconductor chip having a top surface and a bottom surface opposite the top surface of the semiconductor chip and facing the top surface of the substrate, attaching a chip mounting tape to the top surface of the substrate and the top surface of the semiconductor chip, applying a pressure to the chip mounting tape to electrically connect the connection terminal and the connection pad and separating the chip mounting tape from the substrate and the semiconductor chip, wherein the chip mounting tape comprises a tape base film including first and second surfaces opposite to each other and an adhesive film including a third surface facing the first surface of the tape base film, and a fourth surface opposite to the third surface, wherein the adhesive film includes a plurality of voids therein, and wherein the semiconductor chip is adhered to the fourth surface of the adhesive film.

According to an aspect of the present disclosure, there is provided a method of manufacturing a semiconductor package, the method comprising providing a substrate including connection pads, the substrate including a top surface and a bottom surface, placing, on the connection pads, a first semiconductor chip including a first connection terminal and a second semiconductor chip different from the first semiconductor chip and including a second connection terminal, each of the first semiconductor chip and second semiconductor chip including a top surface, and a bottom surface facing the top surface of the substrate, attaching a chip mounting tape to the top surface of the substrate and the top surfaces of the first and second semiconductor chips, loading the substrate to which the chip mounting tape is attached into a chamber, wherein the chip mounting tape seals the top surfaces of the first and second semiconductor chips and the top surface of the substrate from a region in the chamber above the substrate and first and semiconductor chips, increasing an internal pressure and an internal temperature of the chamber to electrically connect the connection pads and the first and second connection terminals, respectively, and separating the chip mounting tape from the substrate and the first and second semiconductor chips.

BRIEF DESCRIPTION OF THE DRAWINGS

The above and other aspects and features of the present disclosure will become more apparent by describing in detail exemplary embodiments thereof with reference to the attached drawings, in which:

FIGS. 6, 7, 8A, 8B, and 9 to 13 are views for explaining a method of manufacturing a semiconductor package according to some embodiments of the present disclosure.

DETAILED DESCRIPTION OF THE EMBODIMENTS

Hereinafter, exemplary embodiments of the present disclosure will be described with reference to the accompanying drawings. In following description made with reference to FIGS. 1 to 7, 8A, 8B, and 9 to 13, the same reference numbers are used to refer to substantially the same components, and a redundant description of the corresponding components will be omitted.

Figure 1:
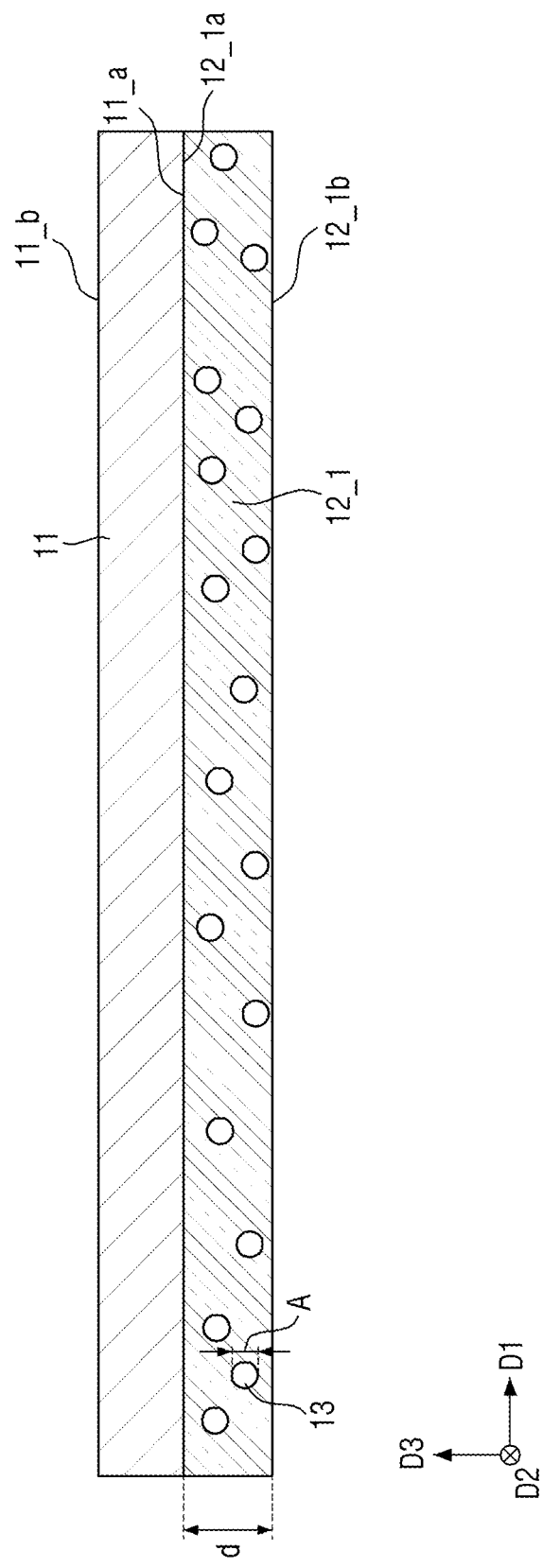
FIG. 1 is a view for explaining a semiconductor chip mounting tape according to some embodiments of the present disclosure.

FIG. 1 is a view for explaining a semiconductor chip mounting tape according to some embodiments of the present disclosure.

The semiconductor chip mounting tape 10 may include a tape base film 11 and an adhesive film 12_1.

The tape base film 11 may include a first surface 11_a and a second surface 11_b that are opposite to each other. The first surface 11_a of the tape base film 11 may denote the bottom surface of the tape base film 11 in a third direction D3, and the second surface 11_b of the tape base film 11 may denote the top surface of the tape base film 11 in the third direction D3.

Terms such as "bottom," "beneath," "below," "top," "above," and the like, may be used herein for ease of description to describe positional relationships. It will be understood that the terms encompass different orientations of the device in addition to the orientation depicted in the figures.

The tape base film 11 may include a heat-resistant resin for the tape base film 11 to maintain its shape in the temperature range of room temperature (about 27° C.) to 400° C. and to remain adhered to the adhesive film 12_1.

Examples of the heat-resistant resin included in the tape base film 11 may include a polyimide resin film, a polyester resin film, a polyvinyl chloride film, a polyolefine resin film, or a fluorine resin film, but the technical spirit of the present disclosure is not limited thereto.

The tape base film 11 may have a thickness in the range of 50 μm to 150 μm. The range is set for maintaining the room temperature shape of the tape base film even at 400° C., but the technical spirit of the present disclosure is not limited thereto. Herein, a thickness may refer to the thickness or height measured in a direction perpendicular to a top surface of the substrate.

The tape base film 11 may include an ultraviolet transmissive material. For example, the tape base film 11 may include a material having an optical isotropy such as polycarbonate (PC) or may have an ultraviolet transmittance adjustable by patterning a material included in the taper base film 11.

In the case where ultraviolet light is irradiated through the second surface 11_b, the ultraviolet ray may penetrate the tape base film 11 to reach the adhesive film 12_1 arranged beneath the first surface 11_a.

The adhesive film 12_1 may include a third surface 12_1a and a fourth surface 12_1b that are opposite to each other. The third surface 12_1a of the adhesive film 12_1 may denote the top surface of the adhesive film 12_1 in the third direction D3 and contact the first surface 11_a of the tape base film 11.

The fourth surface 12_1b of the adhesive film 12_1 may denote the bottom surface of the adhesive film 12_1 in the third direction D3. Although will be described later in FIGS. 8A, 8B, and 9 to 12, the fourth surface 12_1b may contact part of the top surface of a substrate 100 or the top surfaces of semiconductor chips 200 and 300.

The adhesive film 12_1 may have an adhesive property, which may make it possible for the adhesive film 12_1 to remain between the tape base film 11 and the substrate 100 in the temperature range of room temperature to 400° C. For example, the adhesive film 12_1 may maintain an adhesive strength in a range of 90% to 110% of its room temperature adhesive strength in the range of 200° C. to 400° C.

The adhesive film 12_1 may be a well-known tape such as a die-attach film (DAF). The adhesive film 12_1 is not limited in material. Examples of the adhesive film 12_1 may include, but are not limited to, an epoxy material. Depending on an embodiment, however, the adhesive film 12_1 may lose its adhesive property when the ultraviolet light is irradiated thereon.

The adhesive film 12_1 may include a void 13. The void 13 may be a closed system with neither entry nor exit of any material and it may contain gas having a low reactivity. It may be preferable that the gas has a low reactivity in the temperature range of room temperature to 400° C. and in the pressure range of 1 atmospheric pressure to 10 atmospheric pressure (1 atm to 10 atm). In some examples, the gas may include nitrogen ($N_2$) and carbon dioxide ($CO_2$).

The void 13 may be formed in the adhesive film 12_1 using a blowing agent. Although examples of the blowing agent may include azodicarbonamide (ACDA) and dinitroso pentamethylene tetramine (DPT), the technical spirit of the present disclosure is not limited thereto.

The void 13 may have a diameter A falling in the range of 20% to 80% of a thickness d of the adhesive film 12_1. In the case where the diameter A of the void 13 is equal to or less than 20% of the thickness d, it is difficult to apply a pressure to the semiconductor chips 200 and 300 to be described later; in the case where the diameter A of the void is equal to or greater than 80% of the thickness d, it is difficult for the void 13 to maintain its closed system. The thickness d of the adhesive film 12_1 at room temperature under the standard pressure (1 atm) may be in the range of 20 μm to 200 μm.

In example embodiments, the semiconductor chip mounting tape 10 may be configured to be adhered to and may then be adhered to one or more semiconductor chips and a substrate to manufacture a semiconductor package. For example, the semiconductor chip mounting tape 10 may be formed of an adhesive material with adhesive properties toward semiconductor materials, that has a thickness and area sufficiently sized to support a semiconductor chip.

Figure 2:
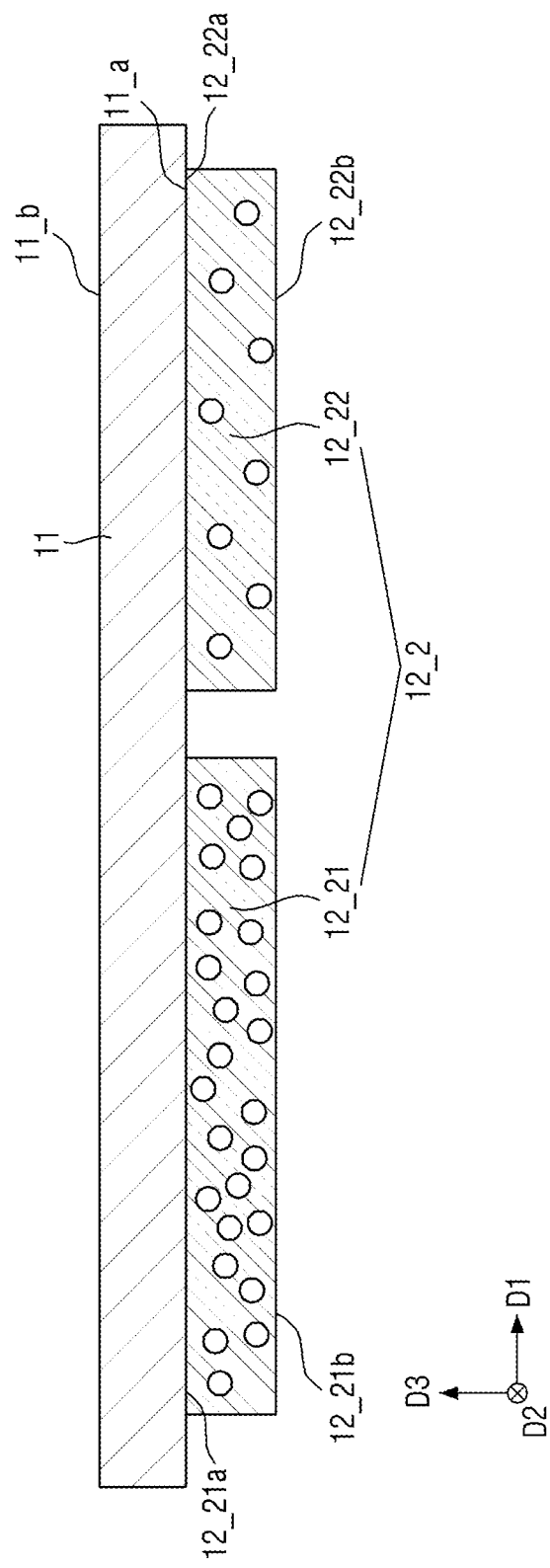
FIG. 2 is a view for explaining a semiconductor chip mounting tape according to some embodiments of the present disclosure.

FIG. 2 is a view for explaining a semiconductor chip mounting tape according to some embodiments of the present disclosure. The following description is mainly directed to differences from FIG. 1.

According to some embodiments, an adhesive film 12_2 of the semiconductor chip mounting tape 10 may include a first region 12_21 and a second region 12_22. The first and second regions 12_21 and 12_22 may be arranged to be spaced apart from each other on the first surface 11_a of the tape base film 11, and the adhesive film 12_2 may be patterned so as to connect the first and second regions 12_21 and 12_22 in a plan view.

The first region 12_21 of the adhesive film 12_2 may include a third_first surface 12_21a and a fourth_first surface 12_21b that are opposite to each other. The third_first surface 12_21a of the first region 12_21 may denote the top surface of the first region 12_21 in the third direction D3 and contact the first surface 11_a of the tape base film 11. The fourth_first surface 12_21b of the first region 12_21 may denote the bottom surface of the first region 12_21 in the third direction D3.

The second region 12_22 of the adhesive film 12_2 may include a third_second surface 12_22a and a fourth_second surface 12_22b that are opposite to each other. The third_second surface 12_22a of the second region 12_22 may denote the top surface of the second region 12_22 in the third direction D3 and contact the first surface 11_a of the tape base film 11. The fourth_second surface 12_22b of the second region 12_22 may denote the bottom surface of the second region 12_22 in the third direction D3.

The number of voids in a unit area (i.e., density) in the first region 12_21 may be greater than the number of voids in the unit area in the second region 12_22. For example, the number of blowing agents in the unit area of the first region 12_21 may be greater than the number of blowing agents in the unit area of the second region 12_22.

A blowing rate (i.e., a density of voids) in the first region 12_21 may be higher than that in the second region 12_22. However, the value relationship is merely an example, and the technical spirit of the present disclosure is not limited thereto. The first and second regions 12_21 and 12_22 may differ in blowing rate.

A shrinkage rate or an expansion rate in the first region 12_21 may be higher than those in the second region 12_22. However, the value relationship is merely an example, and the technical spirit of the present disclosure is not limited thereto. For example, the first and second regions 12_21 and 12_22 may differ in shrinkage rate or in expansion rate.

Figure 3:
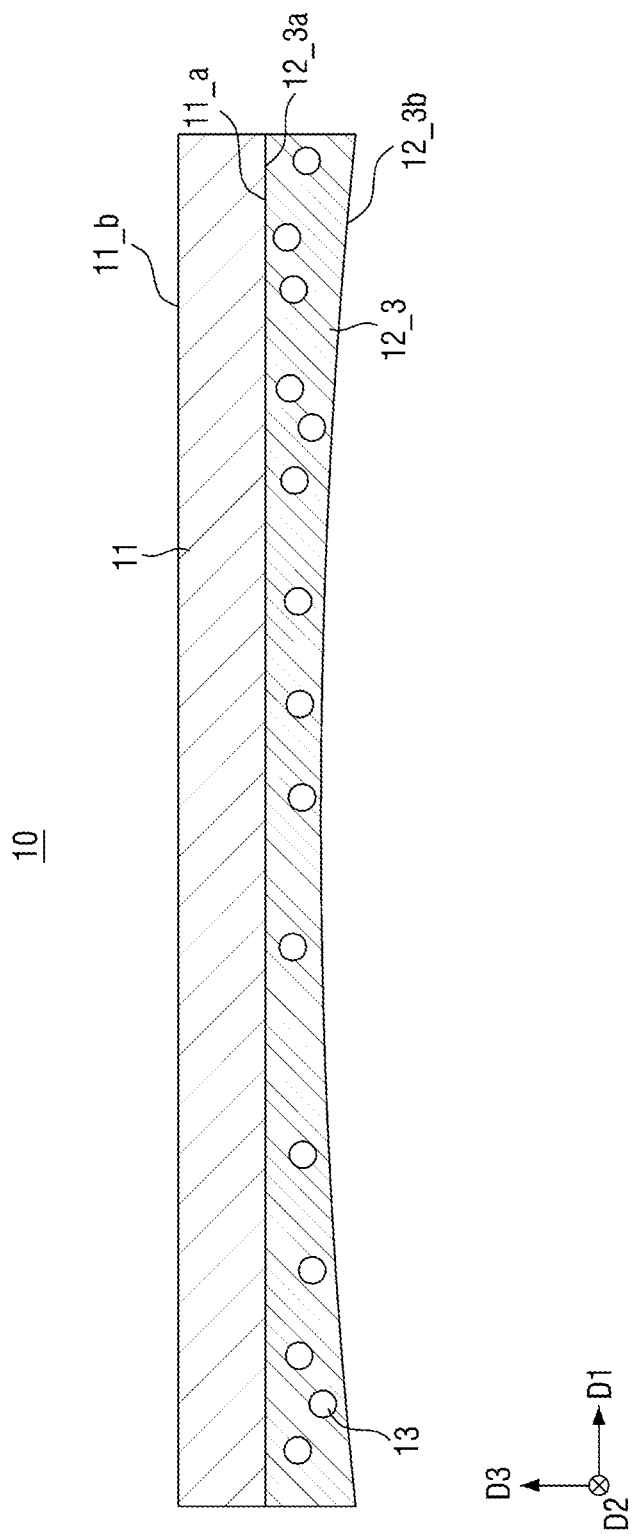
FIG. 3 is a view for explaining a semiconductor chip mounting tape according to some embodiments of the present disclosure.

FIG. 3 is a view for explaining a semiconductor chip mounting tape according to some embodiments of the present disclosure. The following description is mainly directed to differences from FIG. 1.

According to some embodiments, an adhesive film 12_3 of the semiconductor chip mounting tape 10 may include a fourth surface 12_3b contacting the semiconductor chips 200 and 300 to be described later, and the fourth surface 12_3b may be concave upward in the third direction D3. For example, the thickness of the adhesive film 12_3 may be thinner at the center thereof than at the edges thereof.

Figure 4:
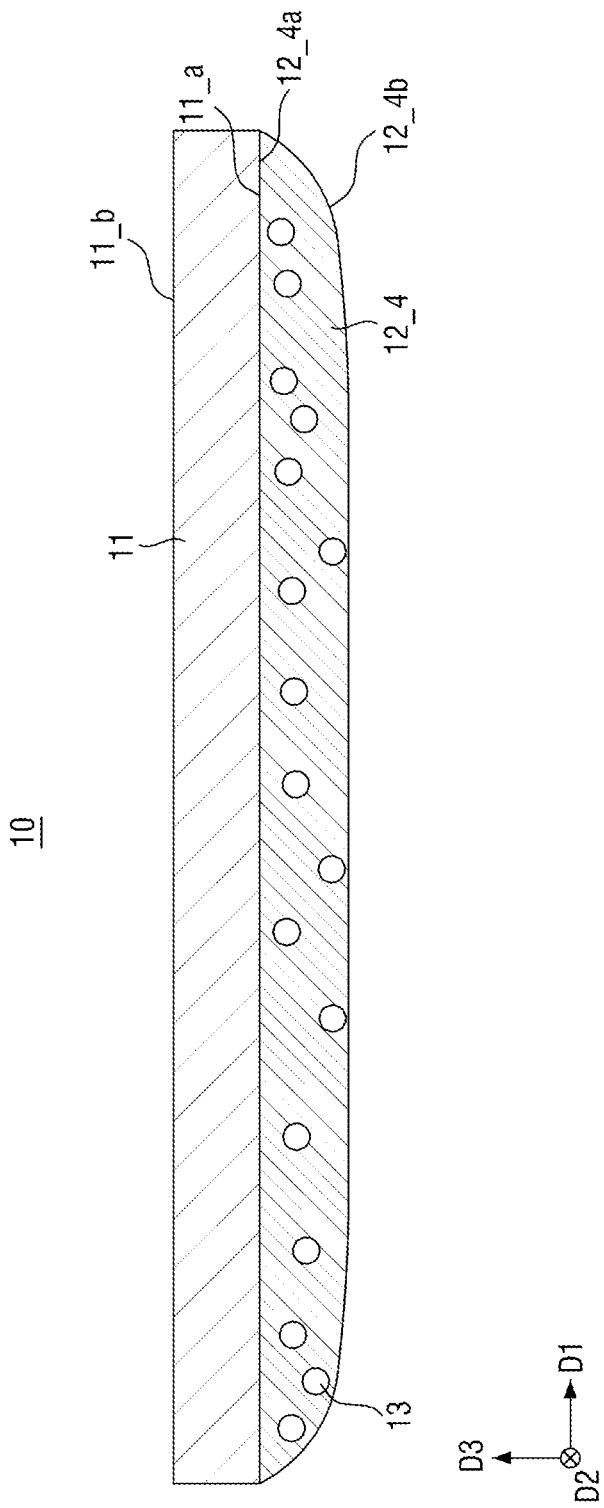
FIG. 4 is a view for explaining a semiconductor chip mounting tape according to some embodiments of the present disclosure.

FIG. 4 is a view for explaining a semiconductor chip mounting tape according to some embodiments of the present disclosure. The following description is mainly directed to differences from FIG. 1.

According to some embodiments, an adhesive film 12_4 of the semiconductor chip mounting tape 10 may include a fourth surface 12_4b contacting the semiconductor chips 200 and 300 to be described later, and the fourth surface 12_4b may be convex downward in the third direction D3. For example, the thickness of the adhesive film 12_4 may be thicker at the center thereof than at the edges thereof.

Figure 5:
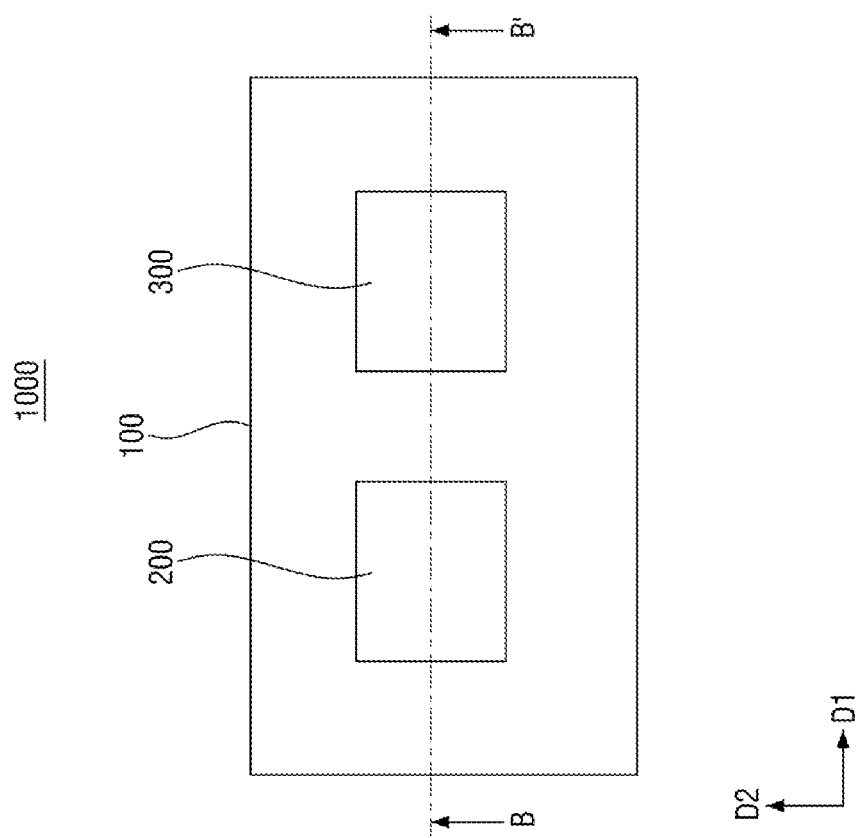
FIG. 5 is a plan view illustrating a semiconductor package for explaining a method of manufacturing a semiconductor package according to some embodiments of the present disclosure.

FIG. 5 is a plan view illustrating a semiconductor package for explaining a method of manufacturing a semiconductor package according to some embodiments of the present disclosure. FIGS. 6, 7, 8A, 8B, and 9 to 13 are views for explaining a method of manufacturing a semiconductor package according to some embodiments of the present disclosure.

FIGS. 6, 7, 8A, 8B, and 9 to 13 are cross-sectional views of a semiconductor package 1000 taken along line B-B' of FIG. 5. In FIGS. 8A, 8B, and 9 to 12, the adhesive film 12 may correspond to the adhesive films 12_1 to 12_4 of FIGS. 1 to 4.

Figure 6:
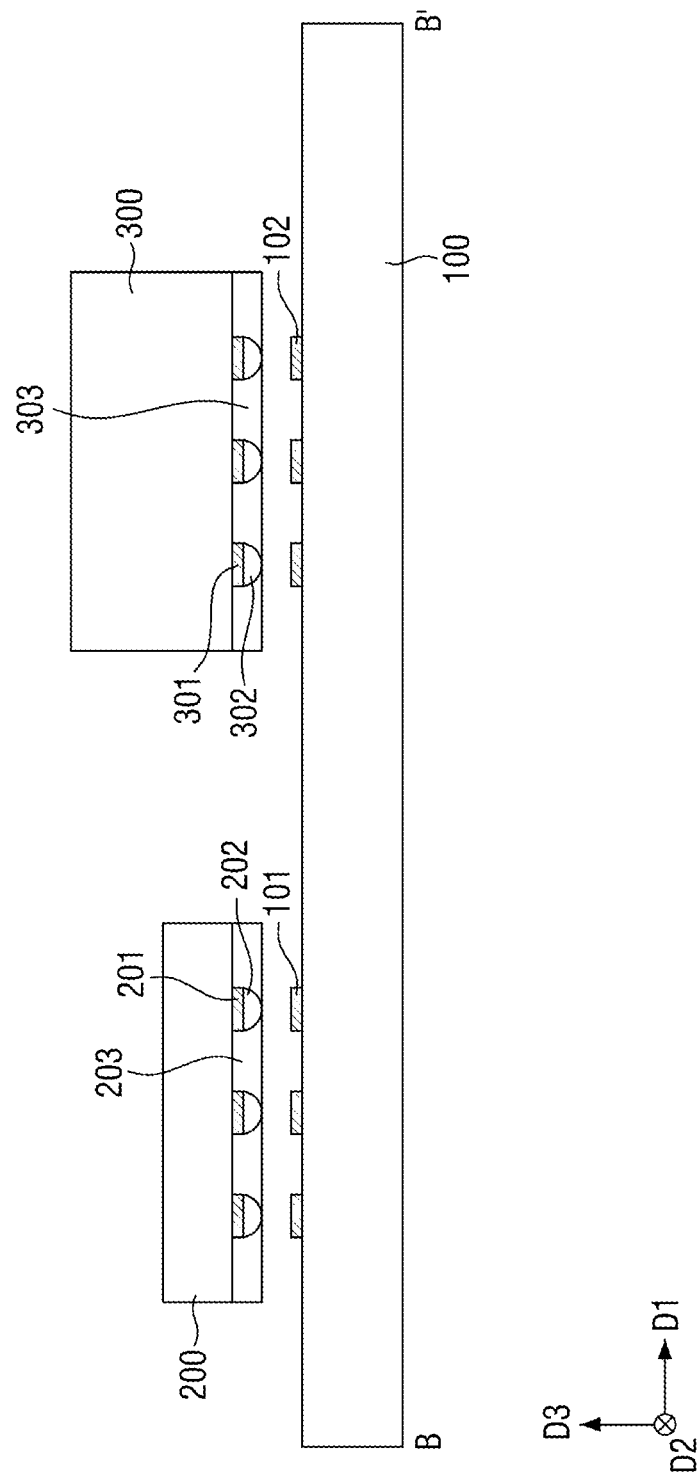

With reference to FIGS. 5 and 6, a substrate 100 including first and second connection pads 101 and 102 may be provided.

The substrate 100 may be a package substrate, for example, a printed circuit board (PCB), a ceramic substrate or the like. When the substrate 100 is the printed circuit board, the substrate 100 may be formed of at least one material selected from phenol resin, epoxy resin and polyimide. For example, the substrate 100 may include at least one material selected from the group including Flame Retardant 4 (FR4), tetrafunctional epoxy, polyphenylene ether, epoxy/polyphenylene oxide, bismaleimide triazine (BT), Thermount, cyanate ester, polyimide and a liquid crystal polymer. Although the substrate 100 may have a surface covered by a solder-resist, the technical spirit of the present disclosure is not limited thereto.

The first and second connection pads 101 and 102 may each be a bump metal structure. For example, the first and second connection pads 101 and 102 may be formed by a well-known metallization method using metal, however, the present disclosure is not limited thereto. The first and second connection pads 101 and 102 may improve connection reliability of the first and second semiconductor chips 200 and 300, which leads to improvement of board-level reliability of the semiconductor package 1000.

The first semiconductor chip 200 may include first connection terminals 201, first connection structures 202, and a first underfill member 203 beneath the bottom surface thereof in the third direction D3. The second semiconductor chip 300 may include second connection terminals 301, second connection structures 302, and a second underfill member 303 beneath the bottom surface thereof in the third direction D3.

Although not shown in the drawings, the first and second connection pads 101 and 102 may each have a passivation layer covering the sidewalls thereof according to an embodiment. The passivation layer may include an oxide layer or a nitride layer, however, the present disclosure is not limited thereto.

Figure 7:
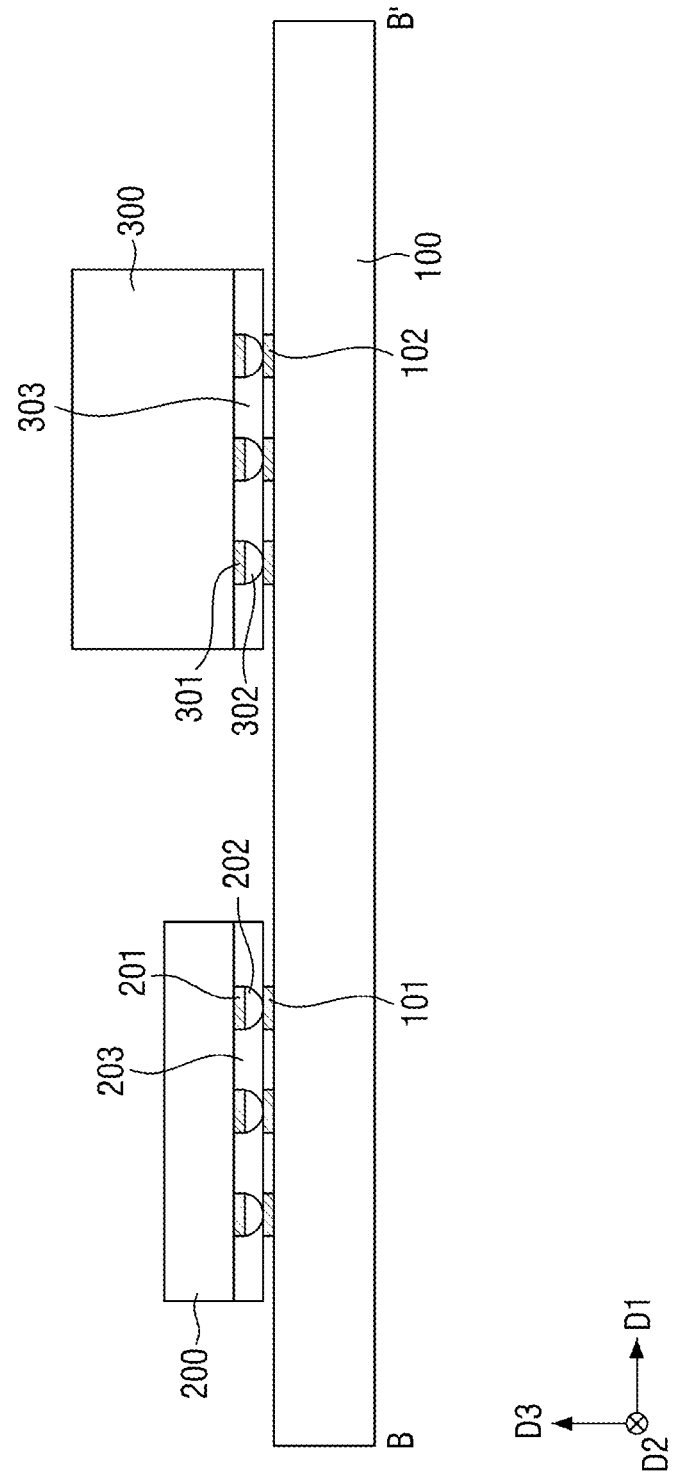

With reference to FIG. 7, the first semiconductor chip 200 including the first connection terminals 201 and the second semiconductor chip 300 including the second connection terminals 301 may be respectively arranged on the first and second connection pads 101 and 102 of the substrate 100.

The first and second semiconductor chips 200 and 300 may be different types of semiconductor chips and, as a consequence, differ in thickness, however, the present disclosure is not limited thereto, and the first and second semiconductor chips 200 and 300 may be the same type of chips.

For example, the first and second semiconductor chips 200 and 300 may have top surfaces different in height from the substrate 100 and, in the case where they are the same type of chips, the first and second semiconductor chips 200 and 300 may have the top surfaces thereof identical in height from the substrate 100.

The first and second semiconductor chips 200 and 300 may be, for example, logic chips. For example, the logic chip may be a central processor unit (CPU), a micro processor unit (MPU), a graphics processor unit (GPU), a controller, or an application specific integrated circuit (ASIC), a modem chip, or the like. Alternatively, the first semiconductor chip 200 may be an application processor (AP) used in a mobile phone or a smartphone.

In the case where the first and second semiconductor chips 200 and 300 are different types of chips, the first semiconductor chip 200 may be, for example, a memory chip. For example, the memory chip may be a volatile memory chip such as a dynamic random access memory (DRAM) or a static random access memory (SRAM), or may be a nonvolatile memory chip such as a phase-change random access memory (PRAM), a magnetoresistive random access memory (MRAM), a ferroelectric random access memory (FeRAM) or a resistive random access memory (RRAM). The memory chip may also be a high bandwidth memory (HBM) chip in which a plurality of DRAM chips are stacked. For example, the first semiconductor chip 200 may be an HBM memory chip.

Although two semiconductor chips 200 and 300 are illustrated in the drawing, the number of semiconductor chips 200 and 300 may vary without being limited thereto. According to an embodiment, the plurality of semiconductor chips 200 and 300 may be electrically connected to the substrate 100 via an interposer layer.

The first connection pads 101 of the substrate 100 may contact the first connection structures 202 of the first semiconductor chip 200.

The second connection pads 102 of the substrate 100 may contact the second connection structures 302 of the second semiconductor chip 300.

The first and second connection terminals 201 and 301 may each be a bump metal structure. For example, the first and second connection terminals 201 and 301 may be formed by a well-known metallization method using metal, however, the present disclosure is not limited thereto. The first and second connection terminals 201 and 301 may improve reliability of connection to the substrate 100, which leads to improvement of board-level reliability of the semiconductor package 1000.

Although not shown in the drawings, the first and second connection terminals 201 and 301 may each have a passivation layer covering the sidewalls thereof according to an embodiment. The passivation layer may include an oxide layer or a nitride layer, however, the present disclosure is not limited thereto. In the case where the first and second connection structures 202 and 302 each has a shape of a solder ball, a solder-resist may be used in the passivation layer.

The first and second connection structures 202 and 302 are not limited in number, in spacing interval, and arrangement form and may be modified enough by those skilled in the art according to a design specification. For example, the number of the first and second connection structures 202 and 302 may be a few dozen to a few thousand, or may be equal to or less or greater than that number according to the numbers of connection pads 101 and 102 and connection terminals 201 and 301. Although the first and second connection structures 202 and 302 are each shown in the shape of a solder ball in FIG. 7, the present disclosure is not limited thereto, and they may each have a shape of a copper pillar.

The first and second underfill members 203 and 303 may each be arranged between the substrate 100 and the first and second semiconductor chips 200 and 300. The first and second underfill members 203 and 303 may respectively surround the first and second connection structures 202 and 302. The first and second underfill members 203 and 303 may protect the first and second connection structures 202 and 302.

The first and second under fill members 203 and 303 may include, for example, epoxy-based resin, benzocyclobutene, or polyimide. However, the embodiments are not limited thereto. For example, the first and second underfill members 203 and 303 may further include a silica filler. In some examples, the first and second underfill members 203 and 303 may include an adhesive or a flux. The flux may include an oxide film remover. In some examples, the first and second underfill members 203 and 303 may include a silica filler or a flux. In some examples, the first and second underfill members 203 and 303 may include a non-conductive paste.

Figure 8A:
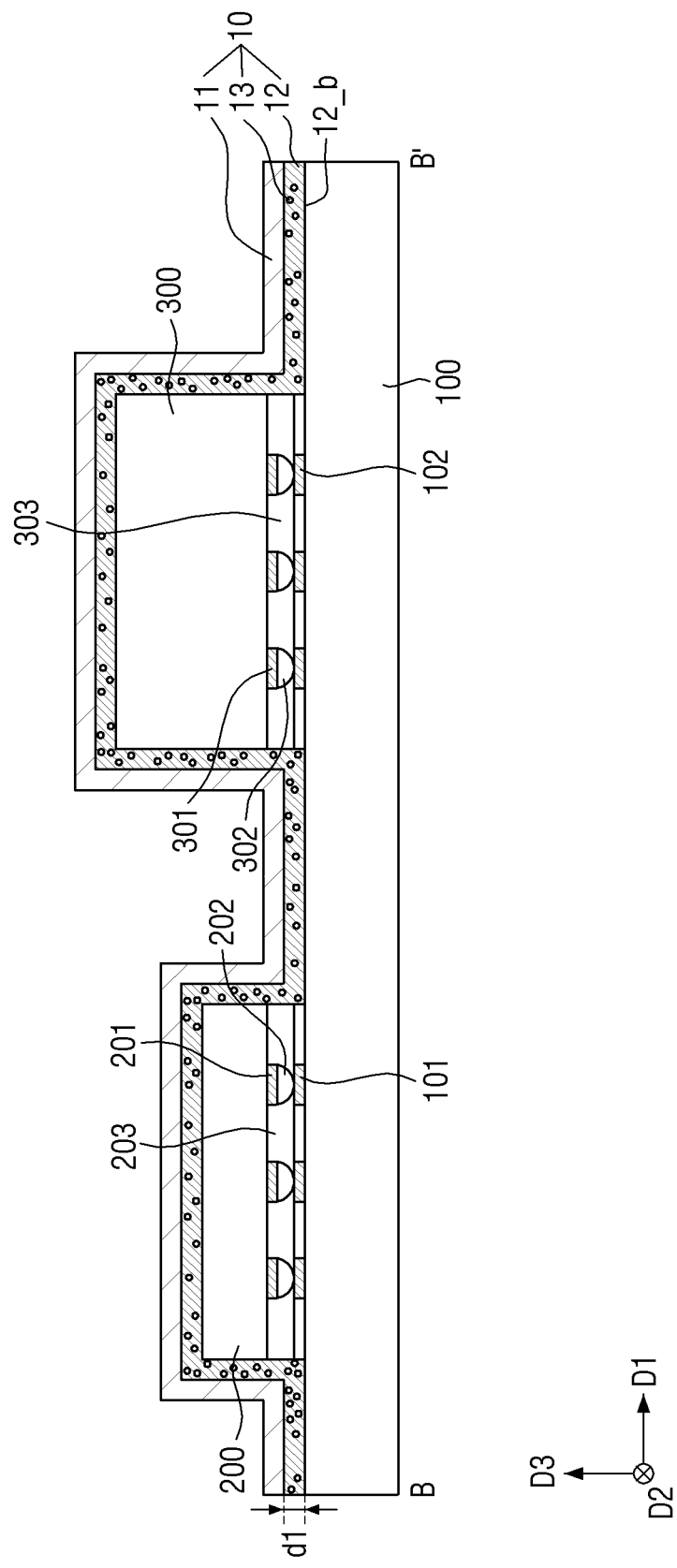

With reference to FIG. 8A, the semiconductor chip mounting tape 10 may be adhered on the top surface of the substrate 100 and the top surfaces of the first and second semiconductor chips 200 and 300.

According to some embodiments, the semiconductor chip mounting tape 10 may include a tape base film 11 and an adhesive film 12 that includes voids 13 and a fourth surface 12_b contacting the substrate 100 and the semiconductor chips 200 and 300.

The fourth surface 12_b of the adhesive film 12 included in the semiconductor chip mounting tape 10 may contact the top surface of the substrate 100 and the top surfaces and the sidewalls of the first and second semiconductor chips 200 and 300. The fourth surface 12_b of the adhesive film 12 may also contact the first and second underfill members 203 and 303.

The semiconductor chip mounting tape 10 may be attached to a region of the substrate 100 between the first and second semiconductor chips 200 and 300 in a method of manufacturing a semiconductor package according to some embodiments, however, the present disclosure is not limited thereto.

This may prevent any vacant space from being created between the sidewalls of the first and second semiconductor chips 200 and 300 and the adhesive film 12.

Figure 8B:
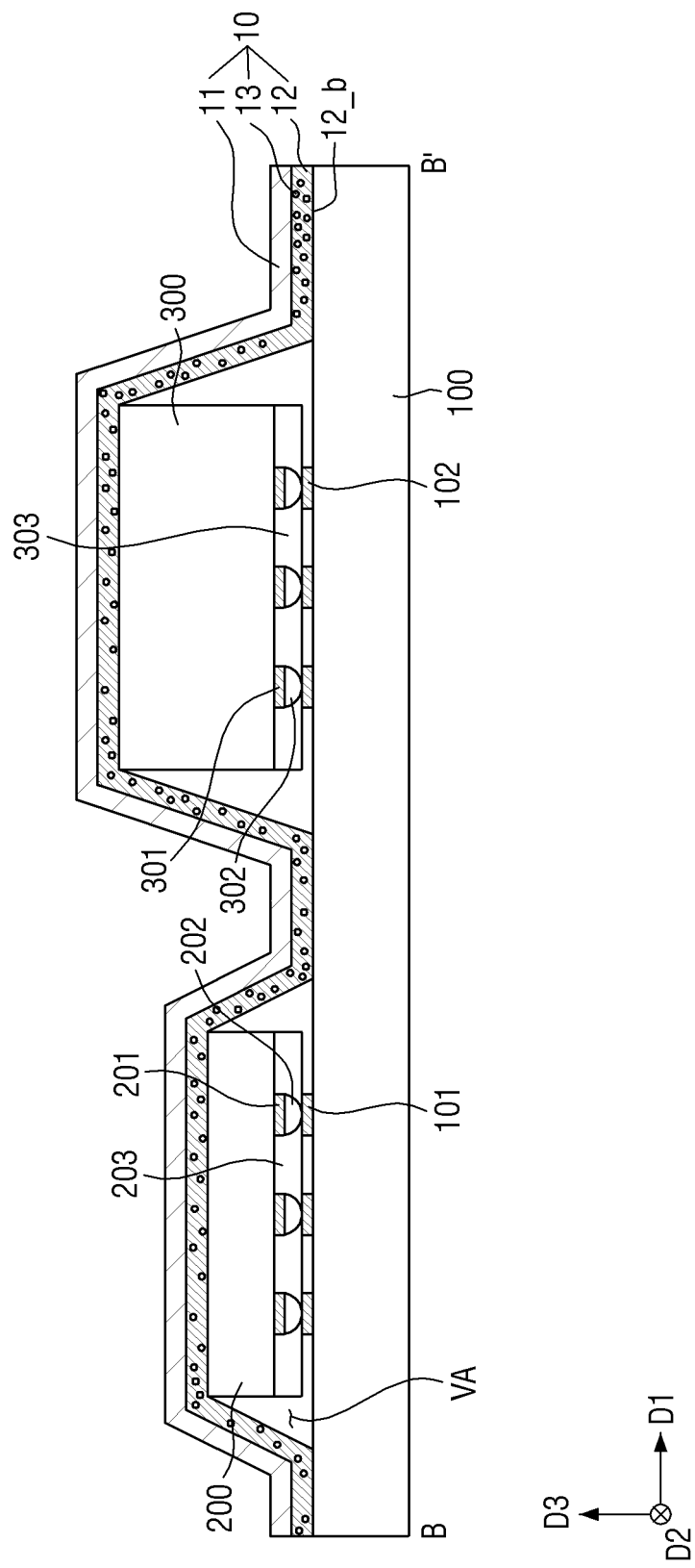

FIG. 8B shows a modified example of FIG. 8A. The following description is mainly directed to differences from FIG. 8A.

The fourth surface 12_b of the adhesive film 12 included in the semiconductor chip mounting tape 10 may contact the top surface of the substrate 100 and the top surfaces of the first and second semiconductor chips 200 and 300.

In this case, a vacant space VA may be created between the sidewalls of the first and second semiconductor chips 200 and 300 and the adhesive film 12. However, the vacant space VA may also remain as a closed system like the void 13.

With reference to FIG. 9, the substrate 100 to which the semiconductor chip mounting tape 10 has been attached may be loaded in a chamber 400. The substrate 100 may be placed on a substrate supporting table 401.

The chip mounting tape 10 may seal the top surfaces of the first and second semiconductor chips 200 and 300 and the top surface of the substrate 100 from a region in the chamber 400 above the substrate 100 and first and semiconductor chips 200 and 300.

After the substrate 100 is placed on the substrate supporting table 401, the substrate 100 and the first and second semiconductor chips 200 and 300 may be electrically connected to each other by increasing both the pressure and temperature inside the chamber 400.

Increasing the pressure inside the chamber 400 may reduce the space of the void 13. In the case of increasing the pressure, the void 13 decreases in volume in inverse proportion to the increased pressure because it is a closed system. As a consequence, the thickness d2 of the adhesive film 12 may decrease in comparison with the thickness d1 in FIG. 8A. Although the pressure inside the chamber 400 may be preferably adjusted in the range of 1 to 10 atmospheric pressure (1 atm to 10 atm), the present disclosure is not limited thereto.

Due to the reduced thickness d2 of the adhesive film 12, the distance between the substrate 100 contacting the adhesive film 12 and the tape base film 11 becomes narrow, which causes a tensile force in the tape base film 11 to apply a force to the tape base film 11 located on the first and second semiconductor chips 200 and 300 towards the substrate 100.

According to some embodiments, a tensile force in the tape base film 11 of the first region 12_21 in FIG. 2 when a force is applied to the tape base film 11 located on the first semiconductor chip 200 towards the substrate 100 may be greater than a tensile force in the tape base film 11 of the second region 12_22 in FIG. 2 when a force is applied to the tape base film 11 located on the second semiconductor chip 300 towards the substrate 100.

Likewise, even in the case of FIG. 8B, the distance between the substrate 100 and the tape base film 11 becomes narrow, and simultaneously the vacant space VA between the sidewalls of the first and second semiconductor chips 200 and 300 and the adhesive film 12 decreases in volume.

A force is applied to the tape base film 11 toward the substrate 100 such that the first and second connection structures 202 and 302 arranged below the first and second semiconductor chips 200 and 300 are compressed.

The chamber 400 may be controlled such that the internal temperature thereof is adjusted. The temperature may be adjusted in a range for melting the first and second connection structures 202 and 302.

The temperature may be adjusted in the range of room temperature to 280° C. in the case where the first and second connection structures 202 and 302 are solder balls and in the range of room temperature to 400° C. in the case where the first and second connection structures 202 and 302 are copper fillers.

The chamber 400 may be controlled such that the internal temperature thereof is adjusted, preferably in the range of room temperature to 400° C., according to the shape of the first and second connection structures 202 and 302. The tape base film 11 may maintain its room temperature shape, producing a tensile force, in the above temperature range, and the adhesive film 12 may maintain an adhesive strength corresponding to its room temperature adhesive strength between the tape base film 11 and the substrate 100.

Figure 10:
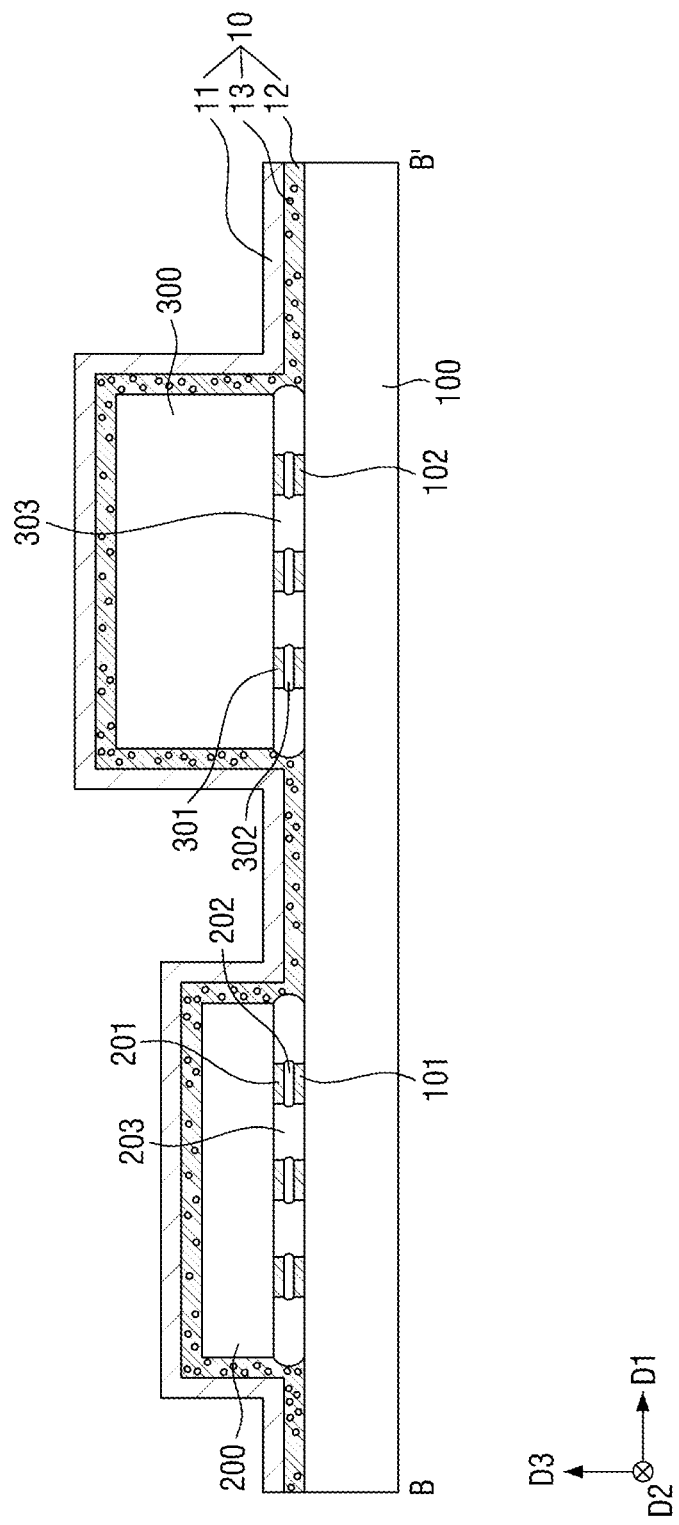

With reference to FIG. 10, the first and second connection structures 202 and 302 may melt down and be compressed to contact and cover parts of the side surfaces of the connection pads 101 and 102 and the connection terminals 201 and 301 or extend along a surface formed along one surface of the passivation layer covering the sidewalls of the connection pads 101 and 102 and the connection terminals 201 and 301.

According to an embodiment, the first and second underfill members 203 and 303 may respectively surround the first and second connection pads 101 and 102 included in the substrate 100 to protect the first and second connection pads 101 and 102. Furthermore, the first and second underfill members 203 and 303 may include parts protruded in the first direction D1 in comparison with the sidewalls of the first and second semiconductor chips 200 and 300.

As the temperature and pressure inside the chamber 400 increase, the first and second connection pads 101 and 102 may be respectively connected to the first and second connection terminals 201 and 301 via the respective first and second connection structures 202 and 302.

The substrate 100 and the first and second semiconductor chips 200 and 300 may be electrically connected with each other.

Figure 11:
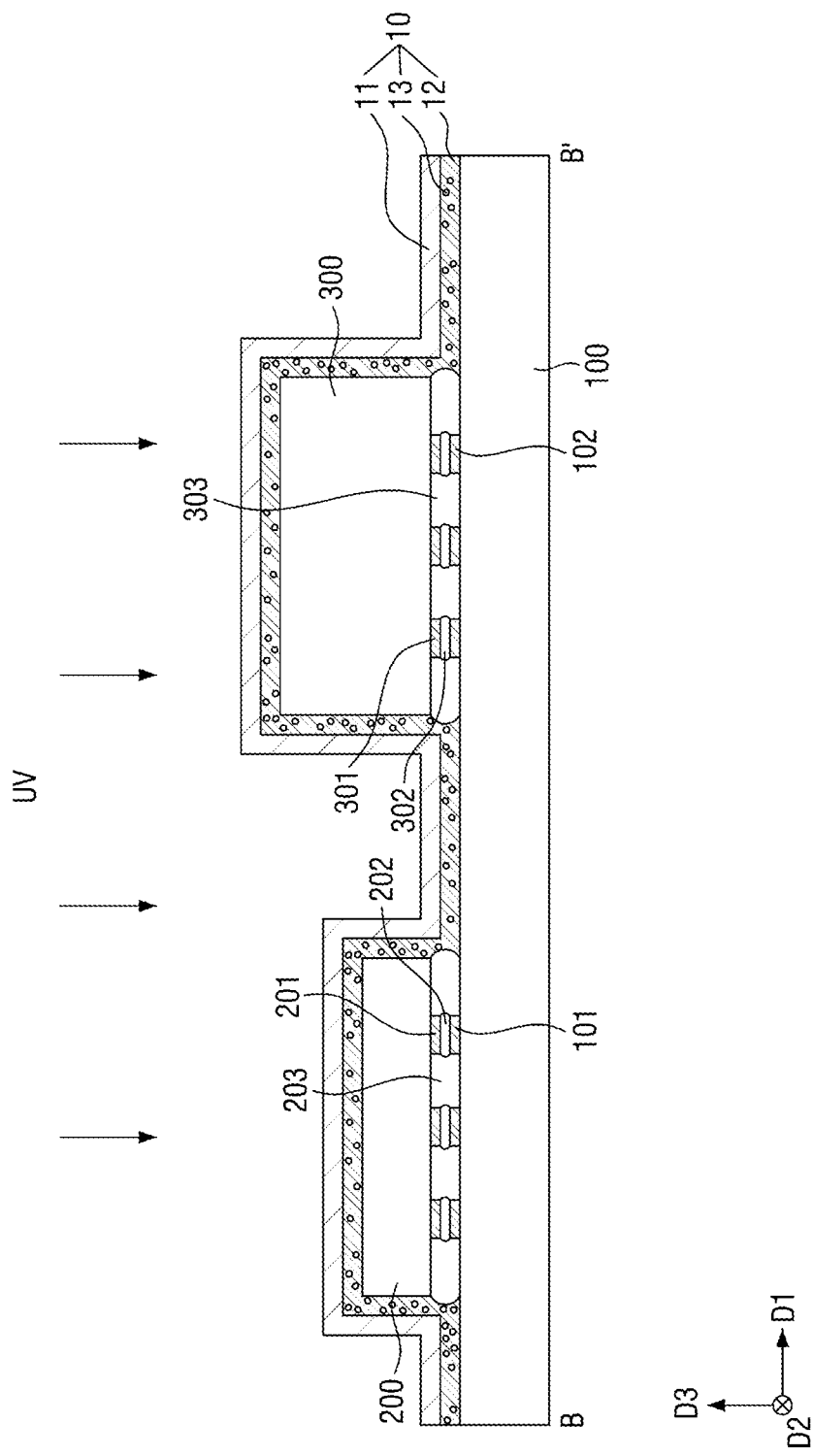

With reference to FIG. 11, ultraviolet (UV) light may be irradiated on the semiconductor chip mounting tape 10 arranged on the substrate 100 and the first and second semiconductor chips 200 and 300 that have been electrically connected to each other. The ultraviolet (UV) light may be an electromagnetic wave having a wavelength equal to or less than 380 nm.

In the case where the ultraviolet (UV) light is irradiated on the semiconductor chip mounting tape 10, it may penetrate the tape base film 11 to reach the adhesive film 12.

The adhesive film 12 on which the ultraviolet (UV) light has been irradiated may lose the adhesive strength.

Figure 12:
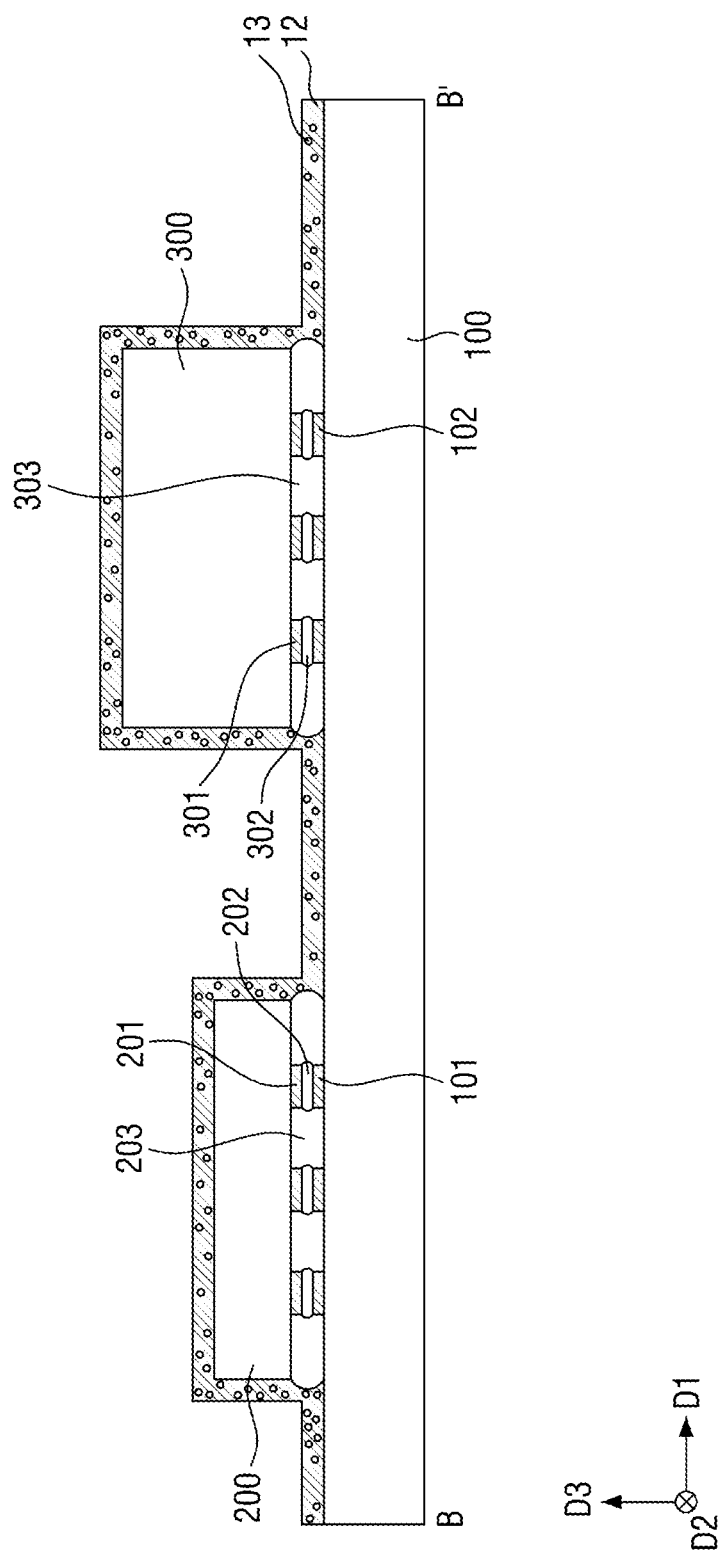
Figure 13:
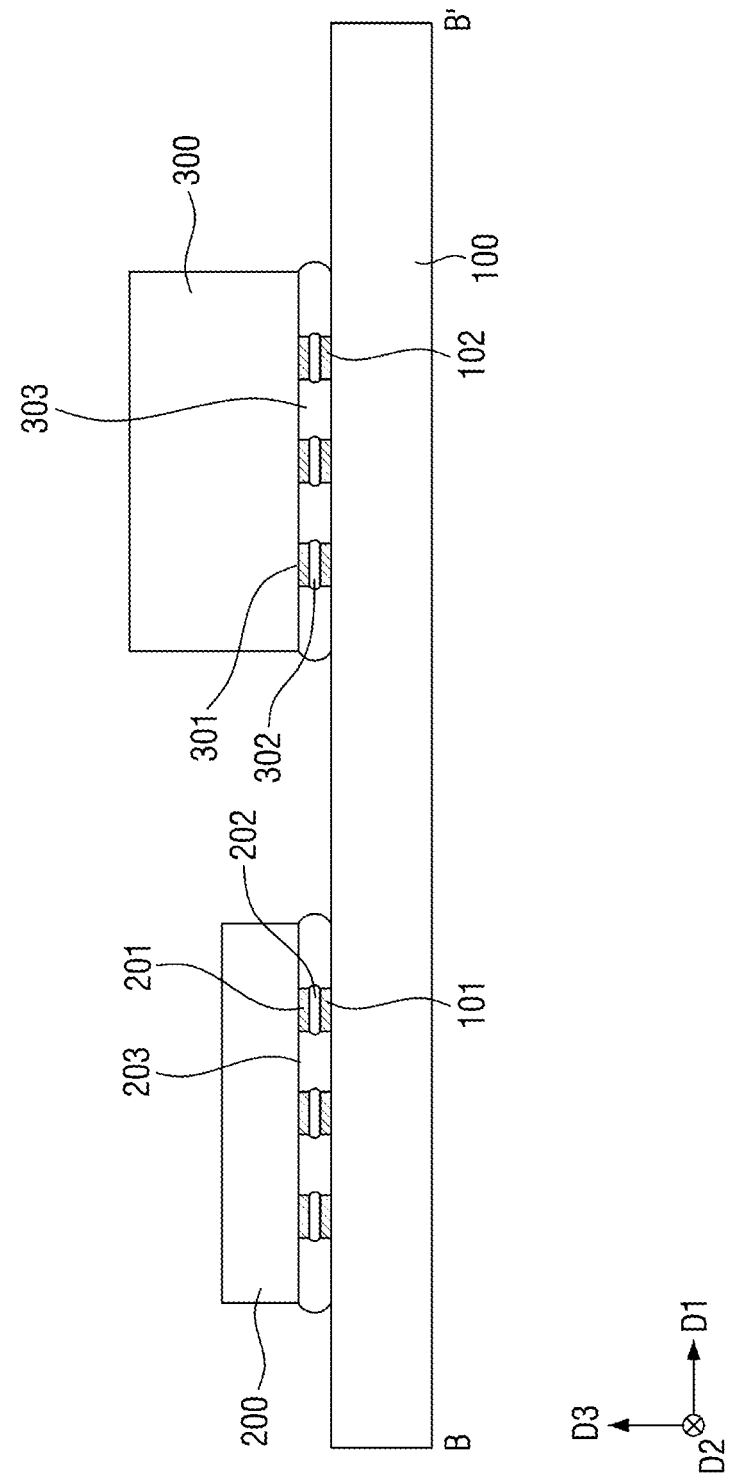

With reference to FIGS. 12 and 13, because the adhesive film 12 has lost the adhesive strength, the tape base film 11 and the adhesive film 12 may be separated from the substrate 100 and the first and second semiconductor chips 200 and 300 in the order disposed in the third direction D3.

Regardless of the disposed order, the semiconductor chip mounting tape 10 may be separated from the substrate 100 in such a way of separating the adhesive film 12 immediately from the substrate 100.

In a method of manufacturing a semiconductor package according to some embodiments, it may be possible to separate the semiconductor chip mounting tape 10 from the substrate 100 by peeling off the semiconductor chip mounting tape 10 with a physical force unlike FIGS. 11 to 13 in which the ultraviolet (UV) light is irradiated thereon.

Although not shown, a thickness of the adhesive film 12 in FIGS. 10 to 12 may be the same as the thickness d2 in FIG. 9.

Unlike the present disclosure, a method for bonding individual chips to the substrate via connection structures includes placing the individual chips at positions to be bonded by using a bond head, heating the connection structures to melt such that the connection structures penetrate the underfill members surrounding them to be connected to the connection pads of the substrate, applying a pressure through the bond head to allow solder ball shapes to remain at a predetermined height, and decreasing the temperature to a point where the melted and bonded connection structures solidify.

The above process requires repetitively heating and cooling the connection structures per chip.

A method of manufacturing a semiconductor package according to some embodiments is performed in such a way of placing a plurality of semiconductor chips 200 and 300 on the substrate 100 at one time, attaching the semiconductor chip mounting tape 10 thereon, and mounting the plurality of chips 200 and 300 on the substrate 100 using the chamber 400 with neither repetitive heating and cooling processes nor any necessity of applying a pressure through a separate bond head, which may lead to an increase of productivity of the semiconductor package.

This method is capable of simultaneously mounting the semiconductor chips 200 and 300 having different thicknesses using the chamber 400, which leads to improvement of the manufacturing speed.

According to various embodiments, it may be possible to adjust the pressure being applied per semiconductor chip by patterning to the adhesive film 12 or adjusting the thickness or blowing rate in different regions, and the above method makes it possible to adjust the pressure in different regions inside the same chip to prevent defects such as cracks from occurring in manufacturing a semiconductor package, which may improve reliability of the semiconductor package.

However, the effects of the embodiments are not restricted to the one set forth herein. The above and other effects of the embodiments will become more apparent to one of daily skill in the art to which the present disclosure pertains by referencing the appended claims.

What is claimed is:

1. A method of manufacturing a semiconductor package, the method comprising:
    providing a substrate including a connection pad, the substrate having a top surface and a bottom surface opposite the top surface;
    placing a semiconductor chip including a connection terminal on the connection pad, the semiconductor chip having a top surface and a bottom surface opposite the top surface of the semiconductor chip and facing the top surface of the substrate;
    providing an adhesive film and a tape base film contacting each other to form a chip mounting tape, the adhesive film including a plurality of voids therein;
    attaching the chip mounting tape to the top surface of the substrate and the top surface of the semiconductor chip;
    applying a pressure to the chip mounting tape to electrically connect the connection terminal and the connection pad; and
    separating the chip mounting tape from the substrate and the semiconductor chip,
    wherein the applying of the pressure to the chip mounting tape includes:
        reducing a thickness of the adhesive film by decreasing in volume each of the plurality of voids, and
        applying a force to the tape base film towards the substrate by reducing the thickness of the adhesive film to electrically connect the connection terminal and the connection pad.

2. The method of claim 1, wherein the semiconductor chip is a first semiconductor chip of a plurality of semiconductor chips disposed on the substrate, the connection terminal is a first connection terminal, and the connection pad is a first connection pad, and the method further comprises:
    placing a second semiconductor chip including a second connection terminal on a second connection pad, the second semiconductor chip having a top surface and a bottom surface opposite the top surface of the second semiconductor chip and facing the top surface of the substrate, the second semiconductor chip different from the first semiconductor chip; and
    attaching a bottom surface of the adhesive film to the top surface of the second semiconductor chip.

3. The method of claim 2, wherein the attaching of the chip mounting tape comprises attaching the chip mounting tape to a contact area of the substrate located between the first semiconductor chip and the second semiconductor chip.

4. The method of claim 1, wherein the applying of the pressure to the chip mounting tape to electrically connect the connection terminal and the connection pad, comprises:
    loading the substrate into a chamber; and
    adjusting the pressure in the chamber.

5. The method of claim 4, wherein an internal pressure of the chamber is increased to electrically connect the connection terminal and the connection pad.

6. The method of claim 1, wherein the separating of the chip mounting tape comprises irradiating ultraviolet light onto the chip mounting tape,
    wherein the tape base film includes a material transmitting ultraviolet light therethrough, and
    wherein the adhesive film loses its adhesive strength when irradiated with the transmitted ultraviolet light.

7. The method of claim 1, wherein the separating of the chip mounting tape comprises separating the chip mounting tape from the substrate and the semiconductor chip through mechanical peeling.

8. The method of claim 1, wherein the applying of the pressure to the chip mounting tape to electrically connect the connection terminal and the connection pad, comprises:
    electrically connecting the connection terminal and the connection pad by applying both heat and pressure to the chip mounting tape.

9. A method of manufacturing a semiconductor package, the method comprising:
    providing a substrate including connection pads, the substrate including a top surface and a bottom surface;
    placing, on the connection pads, a first semiconductor chip including a first connection terminal and a second semiconductor chip different from the first semiconductor chip and including a second connection terminal, each of the first semiconductor chip and second semiconductor chip including a top surface, and a bottom surface facing the top surface of the substrate;
    providing an adhesive film and a tape base film contacting each other to form a chip mounting tape, the adhesive film including a plurality of voids therein;
    attaching the chip mounting tape to the top surface of the substrate and the top surfaces of the first and second semiconductor chips;
    loading the substrate to which the chip mounting tape is attached into a chamber;
    increasing an internal pressure and an internal temperature of the chamber to electrically connect the connection pads and the first and second connection terminals, respectively; and
    separating the chip mounting tape from the substrate and the first and second semiconductor chips,
    wherein the attaching of the chip mounting tape includes attaching the first and second semiconductor chips to a bottom surface of the adhesive film, and
    wherein the increasing of the internal pressure includes:
        reducing a thickness of the adhesive film by decreasing in volume each of the plurality of voids, and
        applying a force to the tape base film towards the substrate by reducing the thickness of the adhesive film to electrically connect the connection pads and the first and second connection terminals.

10. The method of claim 9, further comprising:
    attaching the chip mounting tape to side surfaces of the first and second semiconductor chips.

11. The method of claim 9, wherein the separating of the chip mounting tape comprises irradiating ultraviolet light onto the chip mounting tape,
    wherein the tape base film includes a material transmitting ultraviolet light, and
    wherein the adhesive film loses its adhesive strength when irradiated with the transmitted ultraviolet light.

12. A method of manufacturing a semiconductor package, the method comprising:
    providing a substrate including connection pads, the substrate including a top surface and a bottom surface;
    placing, on the connection pads, a first semiconductor chip including a first connection terminal and a second semiconductor chip different from the first semiconductor chip and including a second connection terminal, each of the first semiconductor chip and second semiconductor chip including a top surface, and a bottom surface facing the top surface of the substrate;

providing an adhesive film and a tape base film contacting each other to form a chip mounting tape, the adhesive film including a plurality of voids therein;

attaching the chip mounting tape to the top surface of the substrate and the top surfaces of the first and second semiconductor chips;

loading the substrate to which the chip mounting tape is attached into a chamber, wherein the chip mounting tape seals the top surfaces of the first and second semiconductor chips and the top surface of the substrate from a region in the chamber above the substrate and first and semiconductor chips;

increasing an internal pressure and an internal temperature of the chamber to electrically connect the connection pads and the first and second connection terminals, respectively; and separating the chip mounting tape from the substrate and the first and second semiconductor chips, wherein the increasing of the internal pressure and the internal temperature of the chamber includes:
reducing a thickness of the adhesive film by decreasing in volume each of the plurality of voids, and
applying a force to the tape base film towards the substrate by reducing the thickness of the adhesive film to electrically connect the connection pads and the first and second connection terminals.

13. The method of claim 12, wherein the attaching of the chip mounting tape includes conformally forming on the top surfaces of the first and second semiconductor chips and the top surface of the substrate.

14. The method of claim 12, wherein the separating of the chip mounting tape comprises irradiating ultraviolet light onto the chip mounting tape, wherein the tape base film includes a material transmitting ultraviolet light therethrough, and wherein the adhesive film loses its adhesive strength when irradiated with the transmitted ultraviolet light.

* * * * *